United States Patent [19]

Tsukiyama et al.

[11] Patent Number: 4,586,027
[45] Date of Patent: Apr. 29, 1986

[54] METHOD AND SYSTEM FOR DATA COMPRESSION AND RESTORATION

[75] Inventors: Tokuhiro Tsukiyama, Kanagawa; Yoshie Kondo, Odawara; Katsuharu Kakuse, Hadano; Shinpei Saba, Hiratsuka; Syoji Ozaki, Kanagawa; Kunihiro Itoh, Odawara, all of Japan

[73] Assignee: Hitachi, Ltd., Tokyo, Japan

[21] Appl. No.: 638,424

[22] Filed: Aug. 7, 1984

[30] Foreign Application Priority Data

Aug. 8, 1983 [JP] Japan .................. 58-143841

[51] Int. Cl.⁴ .................................. G06F 5/00
[52] U.S. Cl. ........................ 340/347 DD; 364/200
[58] Field of Search .......... 340/347 DD; 364/200, 364/900; 358/261; 360/39, 40, 48

[56] References Cited

U.S. PATENT DOCUMENTS 3,185,823  5/1965  Ellersick ............ 340/347 DD
4,031,515  6/1977  Kashio ................... 364/200

FOREIGN PATENT DOCUMENTS 58-10231  4/1983  Japan .

OTHER PUBLICATIONS

Cook, "IBM Technical Disclosure Bulletin", vol. 16, No. 3, Aug. 1973, pp. 928-929.

Primary Examiner—Charles D. Miller
Attorney, Agent, or Firm—Antonelli, Terry & Wands

[57] ABSTRACT

Method of data compression and restoration wherein an input data string including repetitive data more in number than the specified value is transformed into a data string having a format including the first region where non-compressed data are placed, the second region including a datum representative of a data string section which has undergone the compression process and information indicative of the number of repetitive data, i.e., the length of the data string section, and control information inserted at the front and back of the first region indicative of the number of data included in the first region, said transformed data string being recorded on the recording medium, and, for data reproduction, the first and second regions are identified on the basis of the control information read out on the recording medium so that the compressed data string section is transformed back to the original data string in the form of repetitive data.

7 Claims, 12 Drawing Figures

FIG. 1
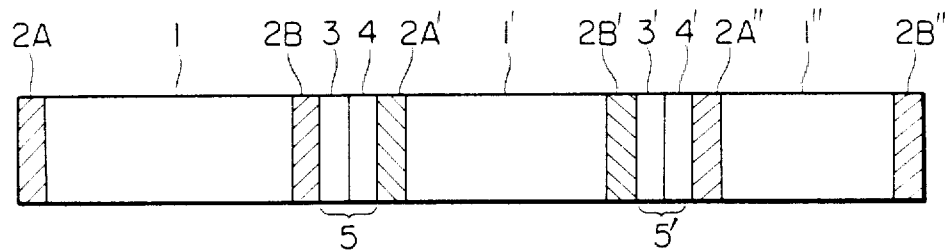
FIG. 2A
FIG. 2B
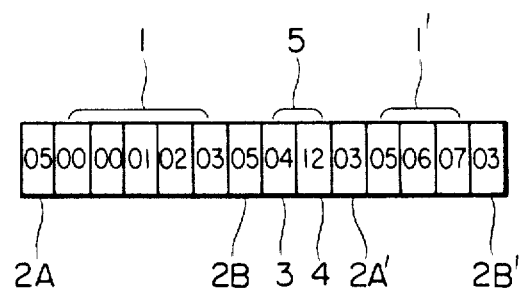

METHOD AND SYSTEM FOR DATA COMPRESSION AND RESTORATION

The present invention relates to a method and system for processing data and, more particularly, to a method and system for data compression and restoration applicable to a sequential file, such as a magnetic tape unit, which allows forward and backward access to data.

In order to use the recording medium efficiently, there have been proposed various data processing methods in which data to be recorded is analyzed to find repetitive data sections, the data is recorded in a compressed form, and the original data is restored in the reproduction process.

However, data compression methods which have been proposed or practiced are designed to work under special software (programs) of the central processing unit, whose processing capacity is impaired due to the increased overhead for the data companding process.

For example, when a magnetic tape unit is used as a backup of a random access magnetic disk file, which is generally divided into areas each including numerous unnecessary data such as spaces in addition to real data, the central processing unit checks through the programmed process whether or not data read out from the magnetic disk file includes repetitive character strings or repetitive strings of character pattern, performs data conversion by compressing the repetitive portions of data, then delivers the compressed data string to the magnetic tape unit.

Conversely, for data read out from the magnetic tape unit, the central processing unit detects through the programmed process the identification information which has been appended to data in the compression process, and performs reconversion for the compressed data portions to retrieve the original data.

Such conventional methods for compression and restoration of data transferred to and from an external storage using software of the central processing unit causes not only the impaired processing capacity due to the increased overhead of the processor as mentioned above, but also increased jobs of the user for preparing such software.

A method of data compression, without the need of aid by software of the central processing unit as described above, but in which method the data compression is carried out by independent hardware, is disclosed in Japanese Patent Application Laid-open No. 102314/83. The data compression circuit shown in this patent publication works in such a way that random portions of a data string fed from the central processing unit are outputted in the original form, while repetitive data portions, e.g., six consecutive bytes of data "0", are outputted in a compressed 3-byte data form, e.g., "0", "0", "6". In this example of compressed data form, the two consecutive bytes "0", "0" indicate the continuous or repetitive data mode and the third byte "6" represents the number of repetitive data. In this method, however, if the compressed data string is read out reversely, the number "6" is read before the 2-byte data "0", "0" indicating the repetitive mode, and the data "6" cannot be distinguished at the time of reading whether it is a random data or a special data indicating the number of repetitive data, and the distinction is only possible after two more bytes have been read. Namely, distinction of a repetitive data portion needs reading of two bytes when data is read out forwardly, or it needs reading of three bytes when data is read out reversely, resulting in a different data restoring operation depending on the data reading direction.

It is an object of the present invention to provide a method and system for processing data in which a data string transferred from the central processing unit to an external storage is compressed on the storage side and the data string restored in the storage is transferred back to the central processing unit.

Another object of the present invention is to provide a method and system for data compression and restoration suitable for storages of the type, such as a magnetic tape unit, which allow forward and reverse access to data on the recording medium in the reproducing operation.

In order to accomplish the above objectives, the present invention features in that a series of data string to be recorded on the recording medium is formatted within the external storage to have the first region where non-compressed data are placed, the second region where compressed data and information representing the number of repetitive data are placed, and control information representing the number of data included in the first region. When data is reproduced, the first and second regions are identified on the basis of the appended control information.

The inventive data compression method is to transform an input data string, which consists of at least one first region of data less in the number of repetitive data than the specified value and at least one second region of data more than or equal in the number of repetitive data to the specified value, into a form having a compressed version of the second region. The method is featured in that the method comprises the steps of:

(a) identifying the first and second regions based on the repetition of data within the input data string, and counting the number of data included in each region, (b) storing a series of data forming the first region in the order of entry, (c) storing the first count indicating the number of data included in the first region, (d) storing the data representative of the second region, (e) storing the second count indicating the number of data included in the second region, and (f) combining the first count of the first region to the front and back of the data string section and pairing the data representative of the second region with the second count of the second region, and outputting them in the order of entry.

According to one embodiment of the present invention, a series of data forming the first region is stored in the first memory area, the first count, the data representative of the second region and the second count are stored sequentially in the second memory area, and data is read out from the first memory area in accordance with the first count read out from the second memory area.

The data processing system according to the present invention for realizing the aforementioned data compression transforms an input data string consisting of at least one first region made up of data less in the number of repetitive than the specified value data and at least one second region made up of data more than or equal in the number of repetitive data to the specified value into output data in the compressed form for the second region, said system comprising a first means which identifies the first and second regions based on the repetition of data in the input data string and outputs the input data string sequentially while temporarily accumulating the input data string for counting the number of data included in each region;

a second means for sequentially storing a series of data relevant to the first region out of the output from the first means;

a third means for storing in a predetermined order the first count indicating the number of data of the first region, the second count indicating the number of data of the second region and a data representative of the second region; and a fourth means which reads out the contents of the third means in such a form that when the first count is read out, data in number indicated by the first count are read out from the second means so that the first count is located at the front and back of a series of data of the first region that is followed by the data representative of the second region and the second count in pair.

These and other objects, features and advantages of the present invention will become more apparent from the following detailed description taken in conjunction with the accompanying drawings, in which:

FIG. 1 is a diagram showing the compressed recording format according to the present invention;

FIG. 2A is a diagram showing the original data string;

FIG. 2B is a diagram showing the data string created by compressing the data string of FIG. 2A according to the present invention;

Figure 3:
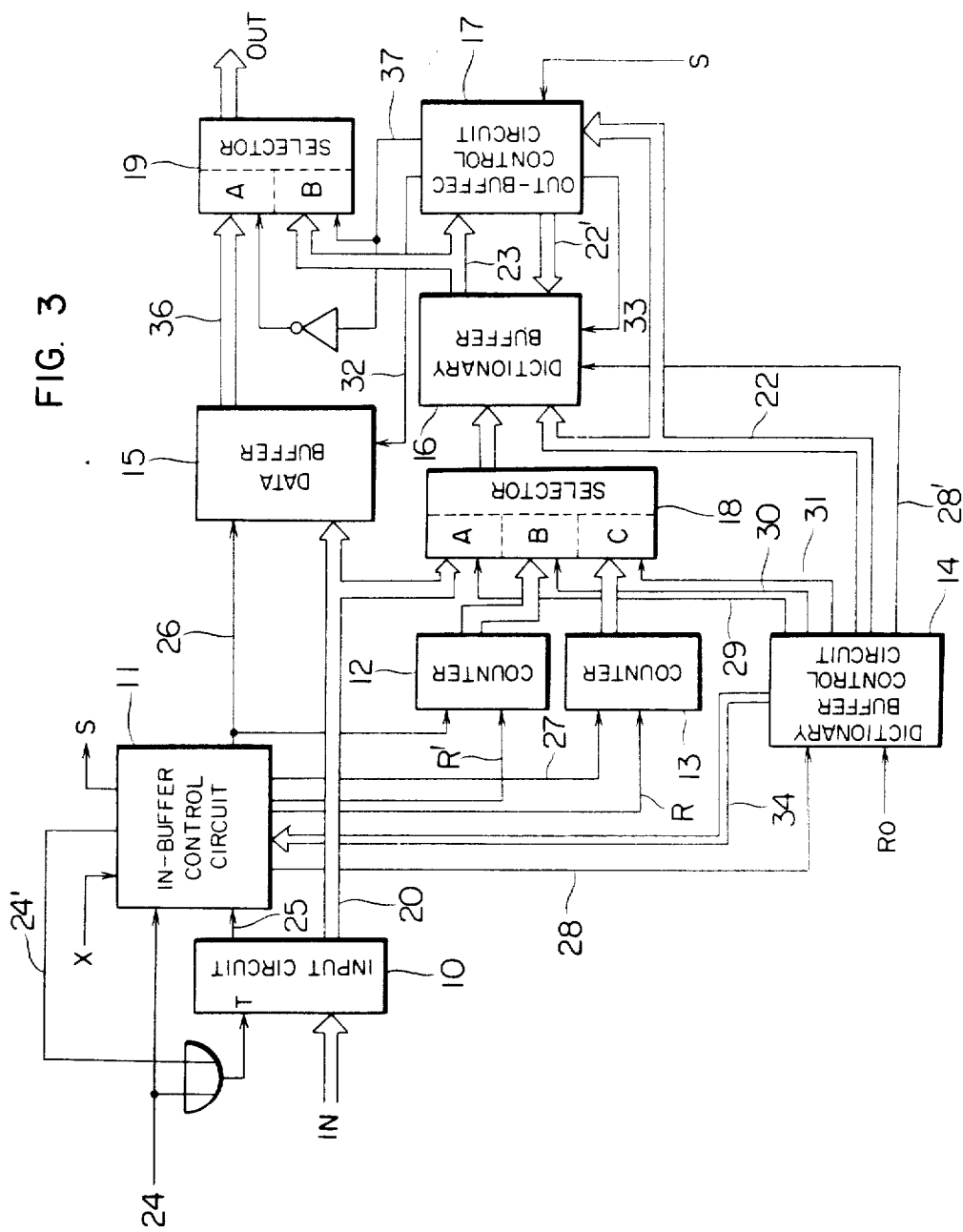
FIG. 3 is a block diagram showing one embodiment of the circuit arrangement for the aforementioned data compression.

FIG. 1 shows the data format of a record on the recording medium according to the present invention. In FIG. 1, reference numerals 1, 1' and 1" denote the first regions where data without being compressed are placed, and control informations 2A, 2B, 2A', 2B', 2A" and 2B" are located at the front and back of these regions, respectively. The 2A and 2B used in pair represent the same numerical information, e.g., a hexadecimal number, indicating the length of region 1, i.e., the number of bytes of data included in region 1. Similarly, 2A' and 2B', and 2A" and 2B" indicate the lengths of regions 1' and 1", respectively.

Located between two contiguous first regions and interposed between the control informations 2B and 2A' and between 2B' and 2A" are the second regions 5 and 5' in which compressed data reside. The second region consists of 1-byte data 3 (3') and numerical information 4 (4') indicating, e.g., in a hexadecimal number, the number of repetitive data in the original data string.

The data compression process in the above-mentioned data format is carried out on condition that a plurality of same data, preferably in number equal to or larger than N bytes which is required for one second region and adjoining two control informations, are located successively in the original data string transferred from the central processing unit to the external storage. Because, if the compression process is conducted for repetitive data less than N, the record length of the control information 2B and 2A' for distinguishing a data compression section from other first region plus the information 4 of the number of repetitive data will become larger than the original record length, resulting in a loss of data compression.

FIGS. 2A and 2B are diagrams used to explain in more detail the aforementioned data compression, FIG. 2A showing the original data format, while FIG. 2B showing the data format after data compressing process. Assuming that each of control informations 2A, 2B, and so on is given a size of one byte, the data block length of one first region defined by these control informations is 256 bytes at maximum. Further assuming that each of data 3 and information 4 indicating the number of repetitive data is given one byte, the condition of data compression is the presence of four or more repetitive data ($N \geq 4$).

In the example shown in FIG. 2A, there are two repetitive data "00" in hexadecimal located at the a-th and b-th positions of the original data string, but these data do not meet the condition of compression. There are 18, or 12 in hexadecimal, repetitive data "04" located at the f-th through w-th positions, and these data satisfy the condition. Accordingly, in the data format after the compression process, 5-byte data at the a-th through e-th positions are recorded in the original form in region 1, and control informations 2A and 2B indicating the byte length of 5 are recorded at the front and back of region 1 as shown in FIG. 2B. In the compression region 5, pattern data 3 indicating that the data pattern under the compression process is "04" and information 4 indicating the number of repetitive data, "12" in hexadecimal, are recorded. The search for repetitive data which meet the condition of compression takes place for the remaining portion following the w-th position, but the result of this example shows that there is no relevant data until the end of the block at the z-th position. Therefore, data at the x-th through z-th positions are placed in the original form in the region 1', with the informations 2A' and 2B' indicating the length of the region 1' recorded at the front and back of it.

According to the rule described above, even if a data block to be processed includes no data section which meets the condition of compression, the recording format is merely required to have a pair of additional control informations 2A and 2B at the front and back of the data block indicative of the length of the data block, and the negative effect due to the additional information for the compression process is very little. On the other hand, the pair of control informations can be used to check the number of bytes of data interposed between them, and by checking the appearance of the second of the control information pair following a data block which is preceded by the first control information, the reliability of reading can be enhanced in the reproducing operation.

Furthermore, according to the rule described above, the control information indicating the length of the first region is always read out first irrespective of the reading direction on the recording medium in the data reproducing operation, and after the first region and the second control information have been read, the second region or the interblock gap will appear, whereby restoration of data is possible in both reading direction. In this case, since the storage unit recognizes the reading direction by itself, whether data read out at the beginning of the second region is the data pattern 3 or the information 4 indicative of the number of data can be determined uniquely based on the reading direction.

Referring to FIGS. 3 to 11, one embodiment of the system arrangement for carrying out the foregoing data compression and restoration method will be described as follows.

Figure 4:
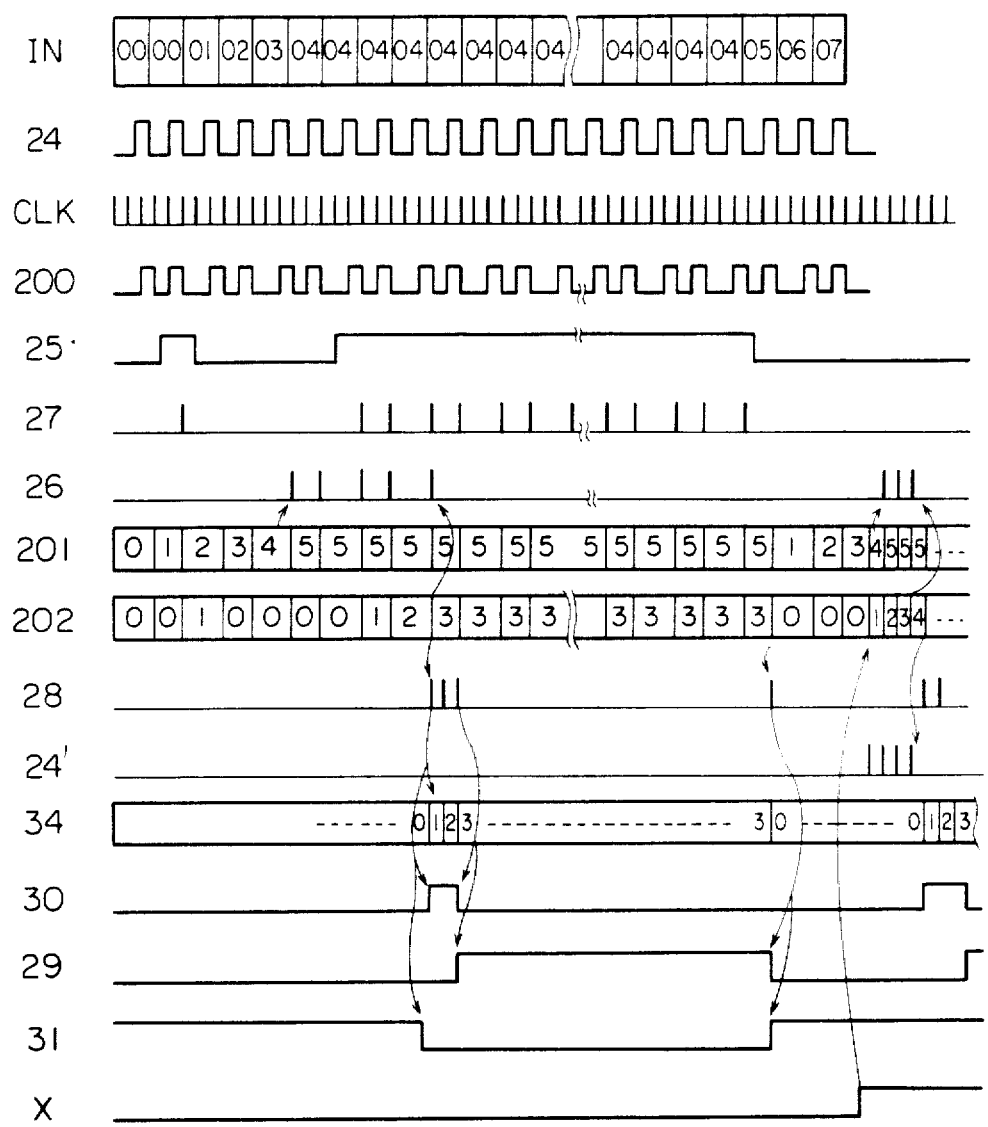
FIG. 4 is a set of timing chart showing the relationship between the input data string and major signals observed in the data compression circuit shown in FIG. 3.
Figure 5:
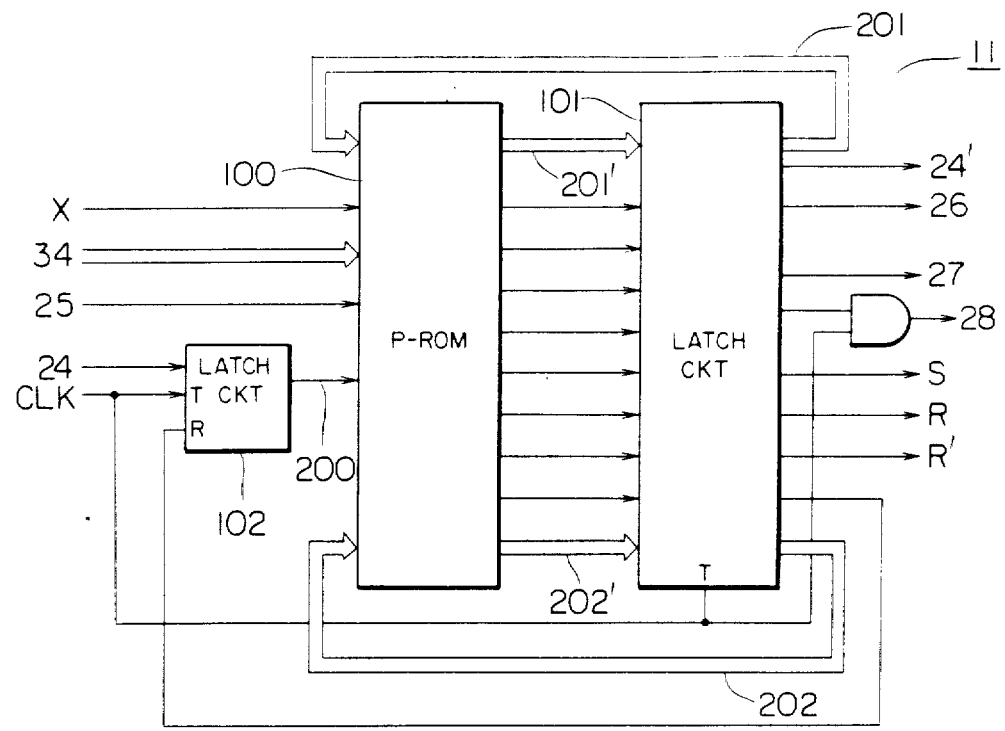
FIG. 5 is a block diagram showing in detail the in-buffer control circuit 11 of FIG. 3.

FIG. 3 shows the arrangement of the data compression circuit which processes a data string IN supplied from the central processing unit and provides a compressed data string OUT, and FIG. 4 shows the timing relationship between the input data IN and the major signals in the above circuit. Data IN in the form of byte sent from the central processing unit in synchronism with the input timing signal 24 is received sequentially by an input circuit 10. The input circuit 10 is made up, for example, of an input buffer consisting of a shift register of N stages which meets the condition of compression, and a comparator which compares data in the first and second stages of the shift register to detect the repetition of data pattern and provides the data coincidence signal 25 while same data are received successively. Reference numeral 11 denotes an in-buffer control circuit which receives the data coincidence signal 25, timing signal 24, data transfer end signal X and status signal 34 provided by a dictionary buffer control circuit 14, as will be described later, and produces various control pulses. As shown in FIG. 5, the in-buffer control circuit 11 is made up, for example, of a memory (will be termed PROM) 100 comprising a read-only memory or programmable logic array which provides stored information by being addressed, a latch circuit 101 which holds the output of the PROM 100 in response to the internal clock CLK, and a flip-flop 102 for producing the internal timing signal 200 synchronized with the timing signal 24. Signals 201 and 202 which are part of the output of the latch circuit 101, in conjunction with the above-mentioned inputs 24, 25, 34 and X, constitute the address signal for the PROM 100. The contents of the PROM 100 read out in accordance with the combined address signal are outputted through the latch circuit 101 as internal signals 201 and 202, control pulses 24', 26, 27, 28, and S, and the reset signals R and R'.

The outputs of the control circuit 11 includes the shift pulse 24' for reading out remaining data from the input circuit 10, the timing pulse 26 for loading output data from the input circuit 10 into the data buffer 15, the count pulse 27 applied to the counter 13 in synchronism with the input timing signal 24 when the coincidence signal 25 is active, the control pulse 28 which operates on a dictionary buffer control circuit 14 to store the control informations 2A and 2B, compressed data 3 and information 4 indicating the number of data when input data satisfies the condition of compression, and the reset pulses R and R' for clearing the counters 13 and 12. The timing of outputting these pulses for the case of compression condition N=4, i.e., the input circuit is made of 4-stage shift register, is as shown in FIG. 4. The values of latch outputs 201 and 202 are determined depending on the previous values and the states of the data coincidence signal 25 and signal X. The latch output 201 carries the number of data which do not meet the condition of compression, while the latch output 202 represents the number of data coincidence pulses 27, with their maximum values limited to $N+1$ and $N-1$, respectively, and the generation of the timing pulse 26, shift pulse 24' and control pulse 28 is controlled depending on these count values.

The counter 12 shown in FIG. 3 is used to count the number of bytes of a data string entered to the data buffer 15 before being subjected to data compression, i.e., the lengths of the previously mentioned first regions 1, 1' and 1", and it operates to count the timing pulse 26 supplied from the in-buffer control circuit 11 to the data buffer 15. The counter is cleared by the reset signal R' provided by the control circuit 11 in response to the suspension of the coincidence signal 25 after the condition of compression has been met.

The counter 13 is used to count the number of compressed data (4), and it consists of a counter for counting the count pulse 27 and a latch circuit for holding the count at reception of the reset signal R. The arrival of the number of repetitive data to the compression condition N is checked by the in-buffer control circuit 11 which generates the count pulse 27. Alternatively, the counter 13 may be provided with a comparator for comparing the count with the reference value N so that the counter 13 generates the compression start signal.

The in-buffer control circuit 11 generates the timing pulse 26 in response to data output from the last stage of the shift register in the input circuit 10 when input data does not satisfy the condition of compression. Consequently, data on the data line 20 are loaded sequentially to the data buffer 15. The timing signal 26 is produced successively unless the number of repetitive data meets the specified value N, and when this condition is met, generation of the timing signal 26 is ceased. At this time point, the shift register in the input circuit 10 contains in its all stages the same data, and all data of the first region to be stored in the data buffer 15 have been outputted. At the end of the repetitive data equal in number to N or more, the in-buffer control circuit 11 counts the number of data shifts in the input circuit 10, and restarts the generation of the timing pulse 26 in response to the output of random data from the input circuit 10. When data in the input circuit 10 satisfies the condition of data compression, the in-buffer control circuit 11 gates the internal clock CLK, as shown in FIG. 4, to issue pulses 28 to the dictionary buffer control circuit 14.

Figure 6:
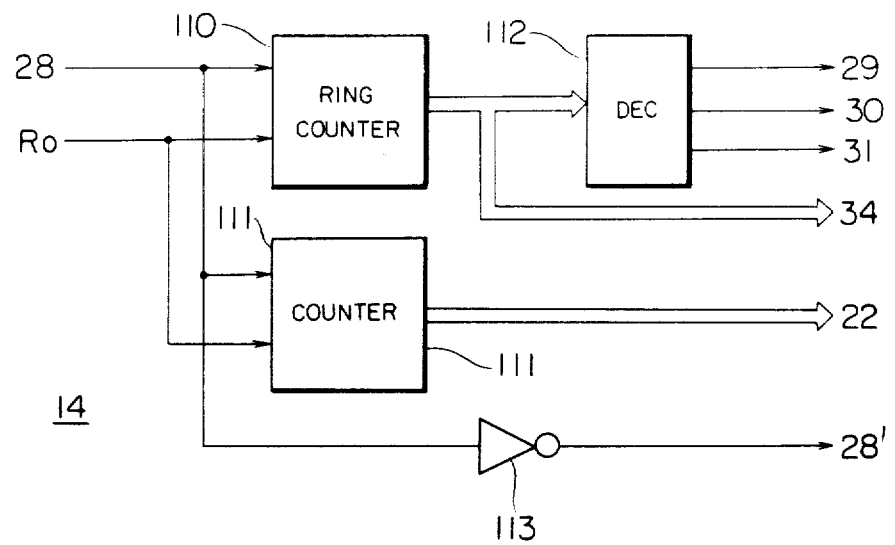
FIG. 6 is a block diagram showing in detail the dictionary buffer control circuit 14 of FIG. 3.

The dictionary buffer control circuit 14 includes, for example, a ring counter 110 having a maximum count of "3" for counting the number of incoming pulses 28, a counter 111 for counting the pulses 28 and outputting the count to the address line 22 of the dictionary buffer 16, a decoder 112 for generating selectively the selection signal 29, 30 or 31 to the selection circuit 18 depending on the output 34 of the ring counter 110, and an inverter circuit 113 for generating the timing signal 28' to the dictionary buffer 16 at each entry of the pulse 28, as shown in FIG. 6.

The selector circuit 18 is used to select data to be loaded to the dictionary buffer 16, and operates to select the output of the input circuit 10, counter 12 or counter 13 in correspondence to the selection signals 29, 30 and 31. The in-buffer control circuit 11 controls the generation of the pulse 28 depending on the states of the data coincidence signal 25, latch output 202 and output 34 of the ring counter 110, and when the ring counter 110 provides "1", the in-buffer control circuit 11 issues the first pulse 28, activating the selection signal 30 for selecting the counter 12. The selection signal 30 goes off when the contents of the ring counter 110 has reached "3" and the selection signal 29 for selecting the output of the input circuit 10 goes on in place of it. Since the dictionary buffer control circuit 14 generates the address signal 22 and data fetch timing signal 28' at each generation of the pulse 28, the contents of the counter 12 selected by the selection signal 30 are loaded twice successively to the dictionary buffer 16 in response to the generation of the first and second pulses 28. The contents of counter 12 indicate the number of bytes of data in the first region, and by this write operation, the control informations 2A and 2B shown in FIG. 1 are stored in the dictionary buffer 16. When the third pulse 28 is generated, the output of the input circuit 10 on the data line 20 selected by the selection signal 29 is loaded to the dictionary buffer 16. At this time point, one of data from the input circuit 10 to be compressed is outputted on the data line 20, and data corresponding to the data 3 of FIG. 1 is loaded to the dictionary buffer 16.

After generating the third pulse 28, the in-buffer control circuit 11 halts the generation of the pulse 28 until the data coincidence signal 25 is suspended. When the data coincidence signal 25 is suspended while the ring counter provides output "3", the in-buffer control circuit 11 generates the fourth pulse 28. Upon reception of the fourth pulse, the ring counter 110 returns to the "0" state, and following the transitions of the selection signal 29 to off and the selection signal 31 to on, the output of the counter 13 is loaded to the dictionary buffer 16. Since the counter 13 holds the number of data to be compressed at the generation of the fourth pulse 28, the numerical information 4 of FIG. 1 is stored in the dictionary buffer 16.

By repeating the foregoing operations, random data and repetitive data short of the condition of compression are stored sequentially in the buffer 15, and repetitive data satisfying the condition are compressed with the control informations appended at its front and back and stored in the dictionary buffer 16.

At the end of data transmission, the host system issues the data transfer end signal X to the in-buffer control circuit 11. On receiving the signal X the in-buffer control circuit 11 processes remaining data in the input circuit 10 using the internal clock CLK. In the embodiment of FIG. 4, following the reception of the signal X, four shift pulses 24' which take the place of input pulses 24 are outputted. This causes the latch outputs 201 and 202 to be counted up, and data "05", "06" and "07" held in the input circuit 10 are loaded to the data buffer 15 in response to the additional timing pulses 26 and the above-mentioned shift pulses 24'. The control informations 2A" and 2B" are entered to the dictionary buffer 16 by the following pulses 28. After the remaining data in the input circuit 10 have been processed, the in-buffer control circuit 11 issues the read cycle start signal S to the out-buffer control circuit 17.

If, for example, input data IN of 32 bytes in a block is a pattern data made of "04" from the top to the end, the in-buffer control circuit 11 provides no data to the data buffer 15, but it operates to load dictionary data in the order of "00", "00", "04", "20", "00" and "00" into the dictionary buffer 16.

Returning to FIG. 3, reference number 17 denotes an out-buffer control circuit which reads out the data buffer 15 and dictionary buffer 16 selectively and outputs the compressed data string OUT corresponding to the input data string IN through the selector 19.

The out-buffer control circuit 17 generates the read timing signal 33 and the address signal 22' which begins with the first address of the dictionary buffer 16, and reads out the contents of the dictionary buffer 16 sequentially onto the signal line 23. At the beginning of reading from the dictionary buffer 16, the control circuit 17 activates the selection signal 37 so that the output from the dictionary buffer 16 is placed on the output line OUT through the selector 19. The first output from the dictionary buffer 16 is the control information 2A, and unless it is zero the control circuit 17 deactivates the selection line 37 so that the selector 19 selects the output 36 of the data buffer 15, then issues the read timing signal 32 to the data buffer 15. The control circuit 17 repeats the output of the read timing signal 32 for the number of times indicated by the control information 2A, and the data buffer 15 sends out data in the order of storing at each entry of the read timing signal 32.

After the specified number of data have been read out of the data buffer 15, the control circuit 17 switches the selector 19 to the dictionary buffer and reads out the control information 2B, data 3 and numerical information 4 sequentially from the dictionary buffer 16 while updating the address 22. When the next control information 2A is read out following the control information 2B, the foregoing operations are repeated, and then a block of data is outputted on the output line OUT in the format shown in FIG. 1.

Figure 7:
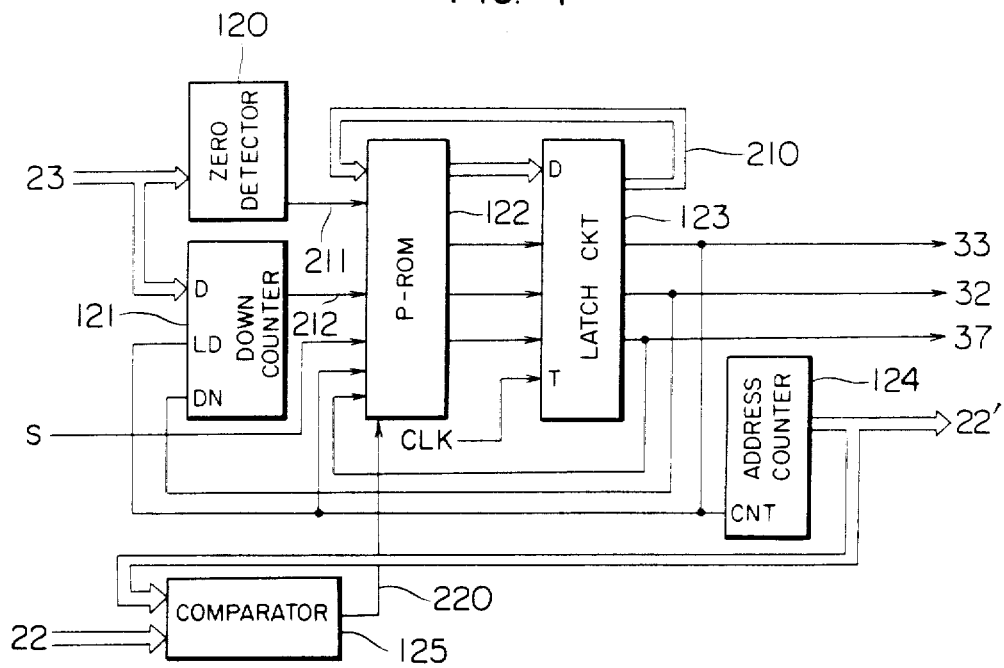
FIG. 7 is a block diagram showing in detail the out-buffer control circuit 17 of FIG. 3.

The function of the out-buffer control circuit can be realized, for example as shown in FIG. 7, by the circuit arrangement including a zero detection circuit 120 which detects the 0's output 23 of the dictionary buffer memory, a down-counter 121 which receives the output 23 of the dictionary buffer memory in response to the read timing signal 33 and decrements the contents each time the read timing signal 32 is generated, a PROM 122 which provides stored information by being addressed, a latch circuit 123 which holds the output of the PROM 122 in response to the internal clock CLK, an address counter 124 which counts the read timing signal 33 to produce the read address 22' for the dictionary buffer 16, and a comparator 125 which memorizes the last value of the address signal 22 provided by the dictionary buffer control circuit 14 and issues the end signal 220 when the output 22' from the address counter 124 coincides with the memorized value. The output of the PROM 122 is determined from the output 211 of the zero detection circuit 120, the output 212 of the down-counter 121, the start signal S, the read timing signal 33, the selection signal 37, and the state of the latch output 210, all of which are supplied as the address of the PROM 122.

Figure 8:
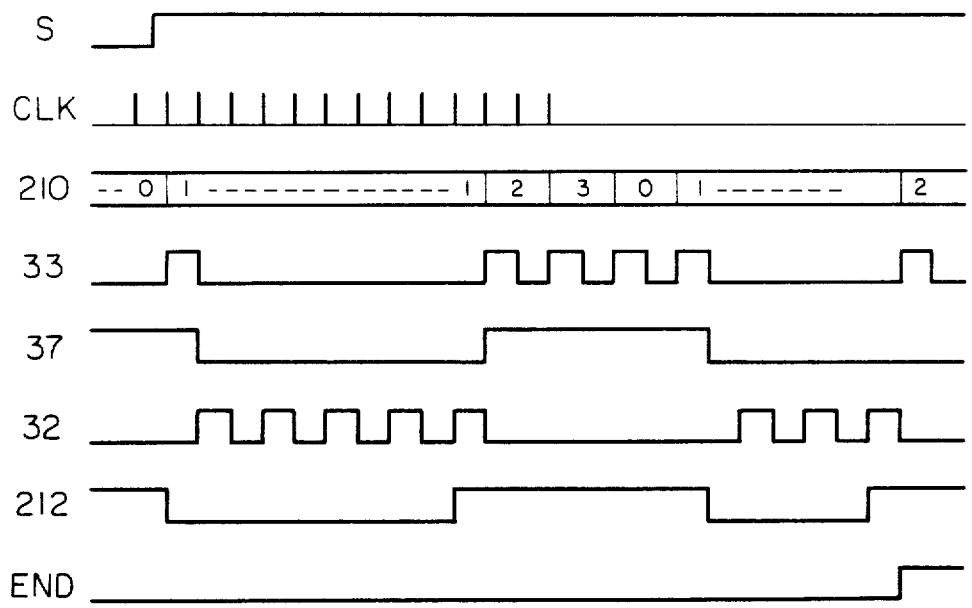
FIG. 8 is a set of timing chart showing the major signals observed in the out-buffer control circuit 17.

FIG. 8 is a set of timing charts showing the major signals observed in the out-buffer control circuit 17.

Figure 9:
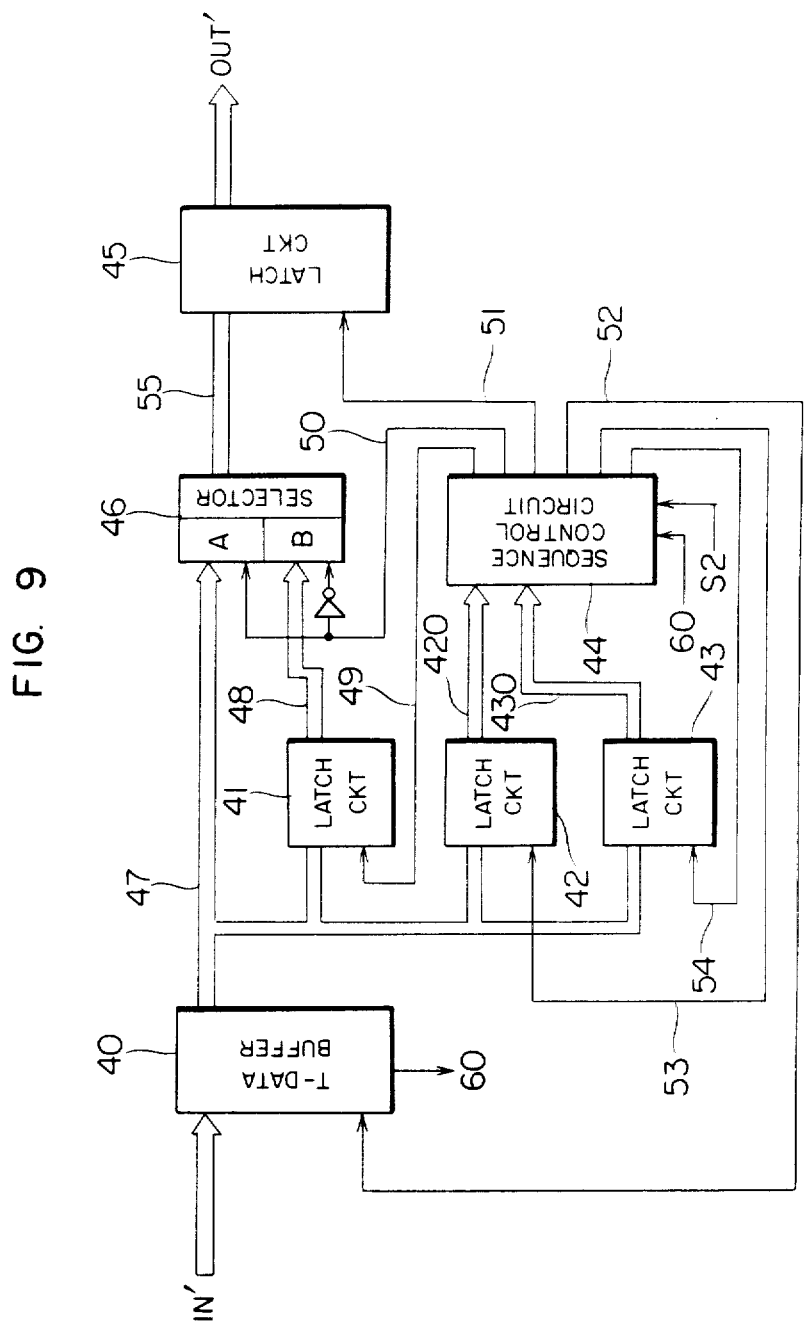
FIG. 9 is a block diagram showing one embodiment of the circuit arrangement for restoring the original data string from the compressed data string.

FIG. 9 shows the arrangement of the circuit section for restoring the original data from the compressed data IN' retrieved from the recording medium. The arrangement includes an input data buffer 40 for temporarily storing a block of compressed data, latch circuits 41, 42 and 43 for holding the dictionary informations, an output data latch circuit 45, a selector circuit 46 which selects one of the output 47 from the data buffer 40 and the output 48 from the data latch circuit 41 and delivers it to the data latch circuit 45, and a control circuit 44 for controlling the operational sequence of these circuit components.

After a block of data retrieved from the recording medium has been stored in the input data buffer 40, the control circuit 44 starts the control of reading out data from the buffer 40 in response to the start signal S2. Reading of data from the input data buffer 40 takes place in response to the timing signal 52. The first read-out data is the control information indicating the number of bytes of data in the first region, and the control circuit 44 provides the latch signal 53 as well as the timing signal 52 so that the control information is held by the latch circuit 42. The control circuit 44 reads the control information held in the latch circuit 42 and, subsequently, carries out the data read operation for the data buffer 40 for a number of times equal to the number of bytes indicated by the control information. Namely, the selection signal 50 is activated to enable the A side of the selector 46, and the read timing signals are sent to the data buffer 40. By making the read timing signal 52 synchronized with the output timing signal 51 for the data latch 45, a series of data corresponding to one of the first regions is sent out as output OUT'.

Following these operations the control circuit 44 outputs the latch signal 53 in synchronism with the read timing signal 52 and loads the latch circuit 42 with a next 1-byte data from the data buffer 40. This data is expected to be the control information paired with that which has been read out previously, and the control circuit 44 compares the contents of the latch circuit 42 with the memorized control information. If both control informations do not coincide with each other, indicating a read error on the recording medium, the error processing will proceed.

Data read out next to the above-mentioned control information from the data buffer 40 includes the data 3 constituting the second region in the compressed format and the numerical information 4 indicating the number of repetitive data. In this case, which of 3 and 5 is read out first can be recognized from the direction of reading on the recording medium. Assuming that the data IN' has been read in the forward direction, the control circuit 44 first provides the latch signal 49 together with the read timing signal 52, loads the latch 41 with data 3 read out from the data buffer 40, and then provides the latch signal 54 to load the latch 43 with the control information 4. Subsequently, the control circuit 44 reads the numerical information in the latch circuit 43, and generates the output timing signal 51 for a number of times indicated by the numerical information while enabling the B side of the selector 46 by deactivating the selection signal 50. Through these operations, the compressed data sections are restored to the original repetitive data.

Figure 10:
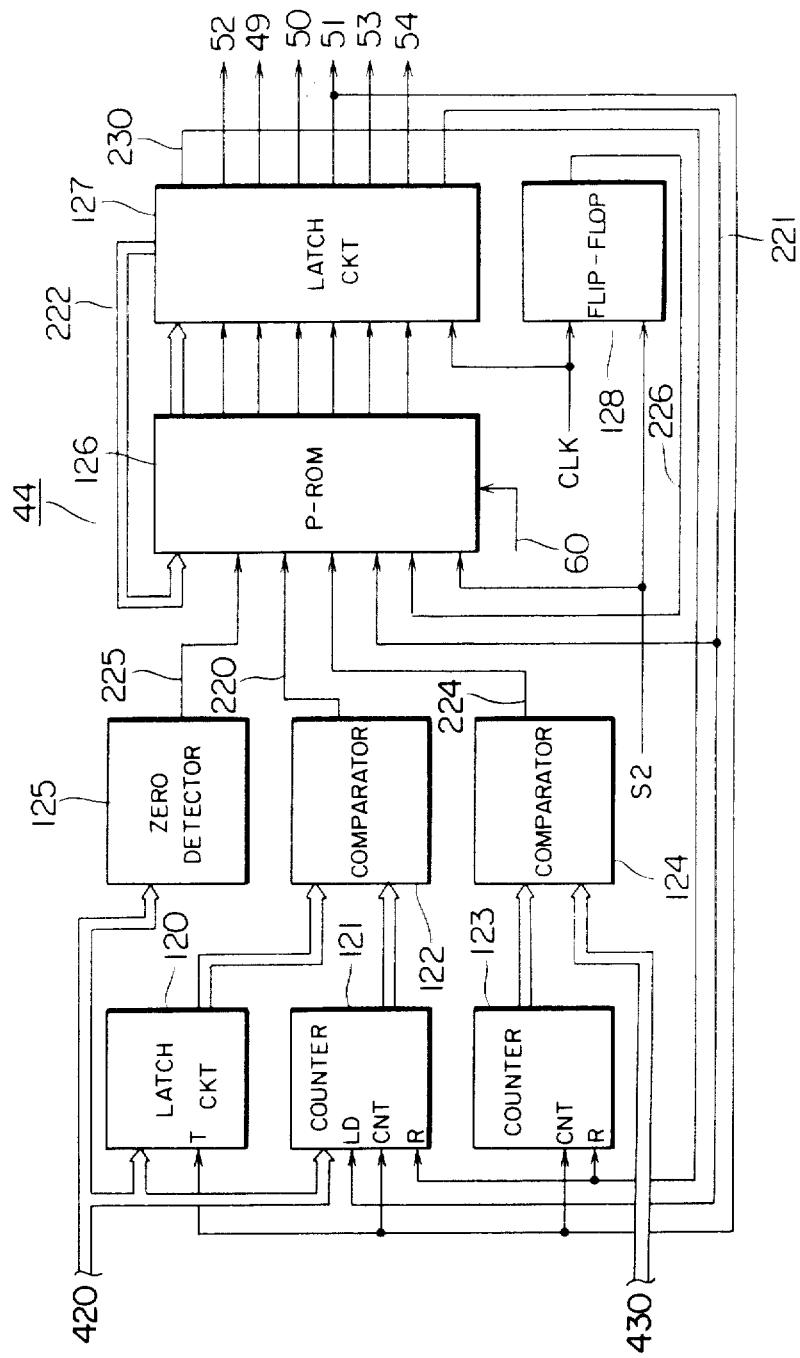
FIG. 10 is a block diagram showing in detail the sequence control circuit 44 of FIG. 9.
Figure 11:
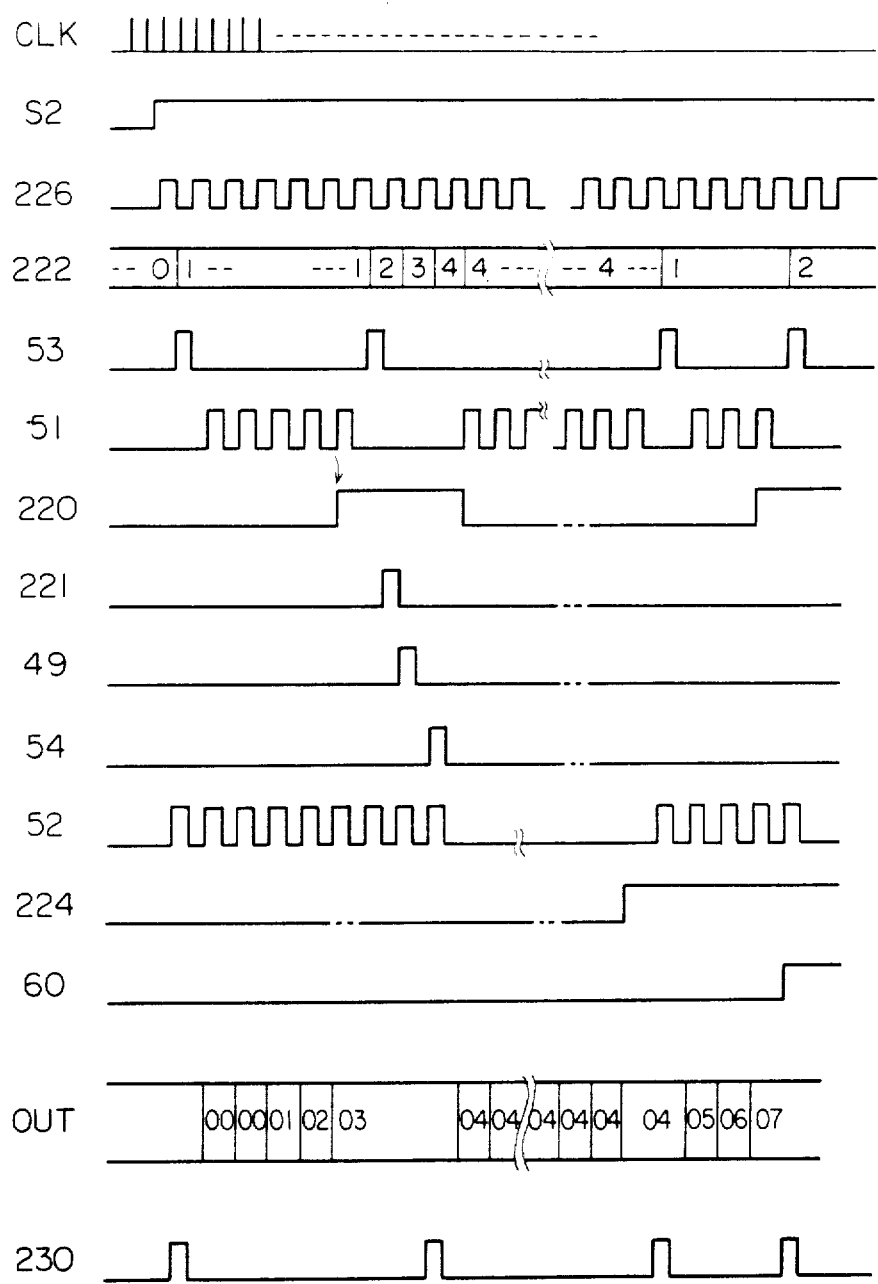
FIG. 11 is a set of timing charts showing the major signals observed in the sequence control circuit 44.

FIG. 10 shows an example of the circuit arrangement of the control circuit 44 for carrying out the foregoing control operation, and FIG. 11 shows the timing relationship of the major signals.

The control circuit 44 consists of a latch circuit 120 which holds the control information 2A from the latch circuit 42 through the signal line 420 in response to the timing signal 51, a first counter 121 having a function of counting the output timing signal 51 and another function of entering the control information 2B which is provided on the signal line 420 when the control signal 221 is issued, a comparator 122 for detecting the coincidence of the count of the first counter with the value of the control information 2A held in the latch 120, a second counter 123 which counts the output timing signal 51 for controlling the number of output of the compressed data 3, a comparator 124 for detecting the coincidence of the count of the second counter 123 with the numerical information 4 provided by the latch circuit 43 on the signal line 430, a zero detector 125 for detecting the 0's output on the signal line 420, a PROM 126, a latch circuit 230 which holds information read out of the PROM 126 and provides the control pulses 49 through 54 and internal control signals 221, 222 and 230, and a flip-flop 128 for dividing the internal clock CLK. The PROM 126 receives as address the output 225 of the zero detector 125, the output 220 of the first comparator 122, the output 224 of the second comparator 124, the load timing signal 221 for the control information 2B, the frequency divided pulse 226 from the flip-flop 128, the start signal S2, and the latch output 222, and reads out stored data in accordance with these addressing signals. Then, various control pulses are sent out from the latch circuit 127 as shown in the timing chart of FIG. 11.

The control circuit 44 in the data restoring circuit section reads out data sequentially from the data buffer 40, and transfers the specified bytes of data of the first region to the output data latch 45 through the A side gate of the selector 46 if the preceding data is the control information 2 or 2B located at the top of the first region, or transfers data held in the latch 41 to the output data latch 45 through the B side gate of the selector successively for the specified number of times if the preceding data is the dictionary information 3 or 4 of the second region. As a result, when all data in the data buffer 40 have been processed, the data string in the format given by the central processing unit is reproduced as output OUT.

The system described above can be built in the magnetic tape controller located between the central processing unit and the magnetic tape drive unit, or alternatively it may be incorporated in the controller part of the magnetic tape drive unit.

According to this invention, all control informations, compressed data pattern and information on the number of repetitive data in compression-processed data string can be distinguished from general data on the basis of the control information which is read first in the reproducing operation, eliminating the need for inserting special bit patterns for identifying various information. In addition, the placement of a pair of control informations at the front and back of a data region allows restoration of the original data string in any data reading direction during reproduction, and thus the inventive method and system are particularly advantageous when applied to data compression in magnetic tape recording.

We claim:

1. A data processing method for transforming an input data string including at least one first region consisting of a series of data less in the number of repetitive data than a predetermined value and at least one second region consisting of repetitive data more or equal in the number of repetitive data to said predetermined value into an output data string in a form where said second region is compressed, said method comprising the steps of:

(a) identifying said first and second regions on the basis of the repetition of the same data in said input data string and counting the number of data included in each of said regions; and (b) combining information indicative of the number of data of said first region at the front and back of said first region, pairing a datum representative of said second region with information indicative of the number of data of said second region, and outputting the results in the order of data input.

2. A data compression method for transforming an input data string including at least one first region consisting of a series of data less in the number of repetitive data than a predetermined value and at least one second region consisting of repetitive data more or equal in the number of repetitive data to said predetermined value into an output data string in a form where said second region is compressed, said method comprising the steps of:

(a) identifying said first and second regions on the basis of the repetition of the same data in said input data string and counting the number of data included in each of said regions;

(b) memorizing a series of data forming said first region in the order of input;

(c) memorizing a first count value indicative of the number of data included in said first region;

(d) memorizing a datum representative of said second region;

(e) memorizing a second count value indicative of the number of data included in said second region; and (f) combining said first count value at the front and back of said first region, for said first region, pairing said representative datum with said second count value, for said second region, and outputting the results in the order of input.

3. A data compression method according to claim 2, wherein a series of data forming said first region are stored in a first memory area, said first count value, said representative datum for the second region and said second count value are stored sequentially in a second memory area, and data in said first memory area are read out in accordance with said first count value read out from said second memory area, thereby accomplishing said step.

4. A data processing system for transforming an input data string including at least one first region consisting of a series of data less in the number of repetitive data than a predetermined value and at least one second region consisting of repetitive data more or equal in the number of repetitive data to said predetermined value into an output data string in a form where said second region is compressed, said system comprising:

first means which identifies said first and second regions on the basis of the repetition of same data in said input data string and outputs said input data string sequentially while temporarily accumulating said input data string for counting the number of data included in each region;

second means for memorizing sequentially a series of data of said first region from among the output of said first means;

third means for memorizing in a predetermined order a first count value indicative of the number of data of said first region, a second count value indicative of the number of data of said second region, both counted by said first means, and a datum representative of said second region; and fourth means for reading out the contents of said third means in such a form that when a first count value has been read out, data equal in number to said first count value are read out from said second means so that said first count value is located at the front and back of a series of data of said first region, which is followed by said representative datum for said second region and said second count value in pair.

5. A data processing system according to claim 4, wherein said third means memorizes two first count values successively, and said fourth means reads out said third means in such a way that after the initial first count value read out from said third means has been outputted, data equal in number to said first count value are read out from said second means, and it is followed by the next first count value read out from said third means and said representative datum for said second region and said second count value in pair.

6. A data processing system for transforming an input data string including at least one first region consisting of a series of data less in the number of repetitive data than a predetermined value and at least one second region consisting of repetitive data more or equal in the number of repetitive data to said predetermined value into an output data string in a form where said second region is compressed, said system comprising:

first memory means which outputs sequentially said input data string entered sequentially at a predetermined timing, while temporarily accumulating said input data string, and detects the repetition of same data to generate a coincidence signal;

second memory means storing sequentially a series of data in the output of said first memory means, said data being those in said first region;

a first counter for counting the number of data included in said first region;

a second counter for counting the number of repetitive data included in said second region;

third memory means for storing a count value of said first counter, a count value of said second counter and a datum representative of said second region;

first control means which identifies said first and second regions on the basis of the timing of data entry to said first memory means and said data coincidence signal generated by said first memory means, and controls the operations of said first counter, second counter, second memory means and third memory means; and second control means which reads out selectively the contents of said first and second memory means in such a way that the count value of said first counter for said first region is combined at the front and back of said first region, and the combined value is followed by said representative datum for said second region and the count value of said second counter in pair.

7. A method of recording and reproduction of a data string including at least one first region consisting of a series of data less in the number of repetitive data than a predetermined value and at least one second region consisting of repetitive data more or equal in the number of repetitive data to said predetermined value, said method comprising the steps of:

(a) recording a data string on a recording medium by converting an original data format into a compressed format in which control information indicative of the number of data included in said first region is combined at the front and end of said first region and, for a data string of said second region, a datum representative of said second region and a number of data included in said second region are paired; and (b) reproducing the record on said recording medium by identifying the first region and the boundary between said first region and a compressed portion in the reproduced data string on the basis of the control information which is read out successively, and by removing said control information and retrieving the repetitive output from the compressed data.

* * * * *